United States Patent
Billiet et al.

(10) Patent No.: US 11,635,693 B2
(45) Date of Patent: Apr. 25, 2023

(54) LITHOGRAPHIC PRINTING PLATE PRECURSOR

(71) Applicant: AGFA OFFSET BV, Mortsel (BE)

(72) Inventors: Thomas Billiet, Mortsel (BE); Katleen Himschoot, Mortsel (BE)

(73) Assignee: AGFA Offset BV, Mortsel (BE)

( * ) Notice: Subject to any disclaimer, the term of this patent is extended or adjusted under 35 U.S.C. 154(b) by 470 days.

(21) Appl. No.: 16/755,895

(22) PCT Filed: Sep. 25, 2018

(86) PCT No.: PCT/EP2018/075848
§ 371 (c)(1),
(2) Date: Apr. 14, 2020

(87) PCT Pub. No.: WO2019/076584
PCT Pub. Date: Apr. 25, 2019

(65) Prior Publication Data
US 2020/0319558 A1 Oct. 8, 2020

(30) Foreign Application Priority Data
Oct. 17, 2017 (EP) .................................. 17196803

(51) Int. Cl.
| | | |
|---|---|---|
| *G03F 7/11* | (2006.01) | |
| *B41C 1/10* | (2006.01) | |
| *G03F 7/027* | (2006.01) | |
| *G03F 7/38* | (2006.01) | |

(52) U.S. Cl.
CPC .............. *G03F 7/11* (2013.01); *B41C 1/1016* (2013.01); *G03F 7/027* (2013.01); *G03F 7/38* (2013.01); *B41C 2201/02* (2013.01); *B41C 2210/04* (2013.01)

(58) Field of Classification Search
None
See application file for complete search history.

(56) References Cited

U.S. PATENT DOCUMENTS

| | | |
|---|---|---|
| 6,420,089 B1 | 7/2002 | Baumann et al. |
| 8,148,048 B2 | 4/2012 | Teng |
| 2008/0280232 A1 | 11/2008 | Kim |
| 2009/0170040 A1 | 7/2009 | Teng |
| 2009/0274979 A1 | 11/2009 | Teng |
| 2011/0053769 A1 | 3/2011 | Masuda et al. |
| 2015/0177618 A1 | 6/2015 | Teng |

FOREIGN PATENT DOCUMENTS

| | | |
|---|---|---|
| CN | 101174090 A | 5/2008 |
| EP | 2 039 509 A1 | 3/2009 |
| JP | 05-303195 A | 11/1993 |
| JP | H05303195 A * | 11/1993 |
| JP | 2001-171250 A | 6/2001 |

OTHER PUBLICATIONS

Official Communication issued in International Patent Application No. PCT/EP2018/075848, dated Oct. 23, 2018.

* cited by examiner

*Primary Examiner* — Joshua D Zimmerman
(74) *Attorney, Agent, or Firm* — Leydig, Voit & Mayer, Ltd.

(57) ABSTRACT

A lithographic printing plate precursor includes a photopolymerizable coating and an overcoat which is deactivated after imagewise exposure and preheating of the precursor.

13 Claims, No Drawings

LITHOGRAPHIC PRINTING PLATE PRECURSOR

CROSS REFERENCE TO RELATED APPLICATIONS

This application is a 371 National Stage Application of PCT/EP2018/075848, filed Sep. 25, 2018. This application claims the benefit of European Application No. 17196803.5, filed Oct. 17, 2017, which is incorporated by reference herein in its entirety.

BACKGROUND OF THE INVENTION

1. Field of the Invention

The invention relates to a novel overcoat composition improving the daylight stability of a photopolymer printing plate.

2. Description of the Related Art

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

The so-called "analogue" printing plates are generally obtained by first applying a so-called computer-to-film (CtF) method, wherein various pre-press steps such as typeface selection, scanning, color separation, screening, trapping, layout and imposition are accomplished digitally and each color selection is transferred to graphic arts film using an imagesetter. After processing, the film can be used as a mask for the exposure of an imaging material called plate precursor and after plate processing, a printing plate is obtained which can be used as a master. Since about 1995, the so-called "computer-to-plate" (CtP) method has gained a lot of interest. This method, also called "direct-to-plate", bypasses the creation of film because the digital document is transferred directly to a printing plate precursor by means of a platesetter. A printing plate precursor for CtP is often called a digital plate.

The support of the lithographic printing plates are typically aluminum supports which have a hydrophilic surface or on which a hydrophilic layer has been provided. This hydrophilic surface and/or layer should improve the water acceptance of the non-printing areas of a lithographic printing plate and the repulsion of the printing ink in these areas. During developing the soluble portions of the coating should be easily removed whereby the surface of the support remains residue-free so that clean background areas are obtained during printing.

Digital plates can roughly be divided in three categories: (i) silver plates, working according to the silver salt diffusion transfer mechanism; (ii) photopolymer plates containing a photopolymerisable composition that hardens upon exposure to light and (iii) thermal plates of which the imaging mechanism is triggered by heat or by light-to-heat conversion.

Photopolymer printing plates rely on a working-mechanism whereby the coating—which typically includes free radically polymerisable compounds—hardens upon exposure, optionally followed by a heating step to enhance or to speed-up this process. "Hardens" means that the coating becomes insoluble or non-dispersible in the developing solution and may be achieved through polymerization and/or crosslinking of the photosensitive coating upon exposure to light. Conventional photopolymer plates were exposed with ultraviolet light from a lamp through a separate photomask film having a predetermined imaging pattern that is placed between the light source and the plate. Nowadays laser sources are generally used to imagewise expose printing plate precursors that are sensitized to a corresponding laser wavelength, allowing the elimination of the photomask film. However, such laser imagable plates often have the drawback of limited room light stability and/or should have a high photospeed (sensitivity) because of the limited power of current laser imagers. Photopolymer plate precursors can be sensitized to blue, green or red light i.e. wavelengths ranging between 450 and 750 nm, to violet light i.e. wavelengths ranging between 350 and 450 nm or to infrared light i.e. wavelengths ranging between 750 and 1500 nm.

Violet laser sensitive photopolymer printing plates typically used for the newspaper market generally have a high sensitivity because of the requirement for fast imaging- or photospeed. As such high sensitive plates generally have limited white room light stability, violet laser sensitive plates usually require yellow light for handling. Indeed, plates with faster photospeed generally have a shorter handling window under white room light, while plates with a longer handling window under white room light generally have slower photospeed.

Photopolymer plates typically contain a polymerizable monomer, a binder, a photoinitiator and a sensitizing dye. In general, a toplayer or protective overcoat layer over the imageable layer which acts as an oxygen barrier layer is required to maintain the sensitivity of the plate. A toplayer typically includes water-soluble or water-swellable polymers such as for example polyvinylalcohol. Besides acting as barrier for oxygen, the toplayer should best be easily removable during processing and be sufficiently transparent for actinic radiation, e.g. from 300 to 450 nm or from 450 to 750 nm or from 750 to 1500 nm.

The classical work flow of photopolymer plates involves first an exposure step of the photopolymer printing plate precursor in a platesetter, followed by an optional preheat step, a wash step of the protective overcoat layer, an alkaline developing step, and a rinse and gum step. Over the past years, there is a clear evolution in the direction of a simplified workflow where the processing and gumming step are carried out in one single step. Alternatively, on-press processing wherein the plate is mounted on the press and the coating layer is developed by interaction with the fountain and ink that are supplied to the cylinder during the press run, has become very popular. During the first runs of the press, the non-image areas are removed from the support and thereby define the non-printing areas of the plate. An on-press developable plate is thus designed to be developed on a lithographic printing press in a pressroom which is generally under white room light. However, as discussed above, violet laser sensitive photopolymer plates disclosed in the prior art often have limited white room light stability and have to be handled in "safe" light. "Safe" light means light with a specific wavelength range that does not cause hardening of the coating; at least for the time required for handling and processing the plate. For most photosensitive coatings, safe light is yellow or red light.

In the art, there is a great interest for violet laser sensitive photopolymer printing plates having both a fast photospeed and a wide handling window under white room light conditions.

U.S. Pat. No. 8,148,048 discloses a method for mechanically peeling off the overcoat of a fast speed lithographic printing plate comprising a substrate, a photosensitive layer, and an overcoat, whereby the daylight stability of the plate is improved.

U.S. Pat. No. 6,420,089 discloses a printing plate precursor which can be developed on press by means of fountain solution and ink in daylight or similar conditions and which comprises an overcoat including a sulfonated azo dye which does not decrease the light sensitivity of the precursor nor other properties such as developability, ink acceptance and storage stability.

A device for removing the overcoat of a photosensitive printing plate comprising a structure whereby the plate is contacted with water preferably under a brushing or rubbing is disclosed in US 2009/0274979. The overcoat removal device is preferably connected to a laser imager so that the plate can be imaged on the laser imager and then directly transferred to the overcoat removal device to remove the overcoat.

US 2015/0177618 discloses the application of a light blocking material which prevents a portion of the room light within the wavelength range from 200 to 780 nm from reaching the photosensitive layer whereby an improved room light stability is obtained.

A method of treating a laser exposed photosensitive lithographic printing plate with a deactivating solution followed by an overall irradiation is disclosed in US 2009/170040. The deactivation solution is capable of deactivating the photohardening capability of the photosensitive layer in the non-hardened areas so that the overall irradiation after the laser exposure does not cause hardening of the photosensitive layer in the non-hardened areas.

US 2008/280232 discloses a laser exposed lithographic plate that can be handled freely under white room light during on-press development. The plate is deactivated by overall applying to the plate a deactivating agent, heat or an overall radiation which does not cause hardening of the photosensitive layer.

It remains a challenge to design a laser sensitive, preferably on-press processable, photopolymer printing plate having both a fast photospeed and a wide handling window (in terms of time) in common pressroom lighting condition, i.e. white room light.

SUMMARY OF THE INVENTION

It is an object of the present invention to provide a negative-working, preferably on-press processable, lithographic printing plate precursor including a photopolymerisable layer which is characterized by a high photospeed and which can be handled freely under white room light after exposure and before/during development.

This object is realized by the printing plate precursor defined below with preferred embodiments also defined below. The invention has the specific feature that the printing plate material includes an overcoat layer which—is at least partly—oxygen permeable after imagewise exposure and heating.

It is a further object of the present invention to provide a method for making a lithographic printing plate comprising the steps of:

image-wise exposing the printing plate precursor including the coating as defined above to light radiation;

heating the exposed precursor;

developing the exposed precursor.

Other features, elements, steps, characteristics and advantages of the present invention will become more apparent from the following detailed description of preferred embodiments of the present invention. Specific embodiments of the invention are also defined in the dependent claims.

DETAILED DESCRIPTION OF THE PREFERRED EMBODIMENTS

The Overcoat

The lithographic printing precursor of the present invention includes on a support a photopolymerizable coating and a top layer provided thereon. The top layer acts as an oxygen-barrier layer and comprises a water-soluble or water-swellable polymer or binder.

The toplayer should be an efficient oxygen barrier layer which adheres sufficiently to the photopolymerisable layer or optional other layers of the coating. Said top layer is hereinafter also referred to as "protective layer", "overcoat layer" or "overcoat". Besides acting as barrier for oxygen, the overcoat layer is preferably easily removable during processing and is sufficiently transparent for actinic radiation, e.g. from 300 to 450 nm or from 700 to 900 nm or from 750 to 1200 nm.

The overcoat can be any film-forming material which is substantially transparent to the imaging light and comprises at least a compound able to generate volatile decomposition products (gasses) upon heating. The temperature at which the compound is able to generate volatile decomposition products (gasses) is preferably between 80° C. and 300° C., more preferably between 100° C. and 250° C. and most preferably between 120° and 200° C. The applied period of this heat; i.e. the dwell time, is preferably between 2 s and 30 minutes, more preferably between 10 s and 15 minutes and most preferably between 15 s and 10 minutes. This heating step, also referred to as "preheat step" may be performed in a preheating unit comprising a heating element including a heating source such as for example a radiation source (an IR-lamp), heated air or a heated roll.

In this thermal treatment step, the formed gasses reduce—at least partly—the oxygen barrier properties of the top layer and as a result, the white room light stability of the printing plate precursor is substantially enhanced. Indeed, oxygen at least partly de-activates the coating whereby (unwanted) polymerization of non-image areas prior to development, due to the exposure of these areas to white room light, is substantially prevented. Unwanted polymerization at non-image areas may lead to fogging, i.e. insufficient clean-out behaviour, resulting in toning on press—i.e. ink acceptance at non-image areas.

The term "deactivate" means that the photosensitive layer has a reduced rate of hardening or even becomes incapable of hardening under white room light. Thus, the photosensitive layer is capable of hardening under room light before the heating or deactivation step, and becomes incapable or has a reduced rate of hardening under room light after the heating or deactivation step.

"Hardening" means that the coating becomes insoluble or non-dispersible for the developing solution and may be achieved through polymerization and/or crosslinking of the photosensitive coating.

This heating step may besides deactivating the non-exposed areas, enhance or speed-up the polymerization and/or crosslinking reaction at the exposed (hardened) areas.

The compounds capable of generating volatile decomposition products are preferably heat decomposable compounds which generate at least one gas upon heating. Said gas(ses) is preferably not-condensable at room temperature such as for example carbon dioxide, carbon mono-oxide, hydrogen gas and/or ammonia; or generates an inert gas such as nitrogen gas. Most preferred compounds are the so-called blowing agents; more information concerning blowing agents can be found in the "Handbook of foaming and blowing agents" by George Wypych, $1^{st}$ Edition, February 2017, chapter 10.

These compounds capable of generating volatile decomposition products preferably are included in the coating at a level between 10% wt and 60% wt, more preferably between 15% wt and 50% wt and most preferably between 20% wt and 40% wt. Specific compounds include, but are not limited to, for example, carbonates such as ammonium carbonate and ammonium hydrogencarbonate, and carbamates such as ammonium carbamate, that undergo decomposition at about 60° C. to generate carbon dioxide and/or ammonia, and hydrazides such as benzenesulfonyl hydrazide or p-toluenesulfonyl hydrazide which decompose to form nitrogen gas. It is preferred that the mentioned compounds are preliminary dissolved or dispersed to that it is added in the form of a solution.

The overcoat layer preferably further comprises a hydrophilic binder. Preferred binders which can be used in the top layer are disclosed in WO2005/029190 (page 36 line 3 to page 39 line 25), US 2007/0020563 (paragraph [0158]) and EP 1 288 720 (paragraphs [0148] and [0149]), including the cited references in these patents and patent applications.

The most preferred binder for the toplayer is polyvinylalcohol and/or derivatives of polyvinyl alcohol. The polyvinylalcohol has preferably a hydrolysis degree ranging between 74 mol % and 99 mol %, more preferably between 88 mol % and 98 mol %. The weight average molecular weight of the polyvinylalcohol can be measured by the viscosity of an aqueous solution, 4% by weight, at 20° C. as defined in DIN 53 015, and this viscosity number ranges preferably between 3 and 26, more preferably between 3 and 15, most preferably between 3 and 10.

A mixture of polyvinylalcohols and/or derivatives of polyvinylalcohol having a different hydrolysis and viscosity number may also be used, for example, a combination of two or more water-soluble polymers such as a combination of polyvinyl alcohol and polyvinylpyrrolidone. Modified polyvinylalcohols, e.g. polyvinylalcohols having a carboxyl group and/or a sulphonic acid group may also be used, preferably together with unmodified polyvinylalcohols.

The coating thickness of the toplayer is preferably between 0.25 and 1.75 $g/m^2$, more preferably between 0.25 and 1.3 $g/m^2$, most preferably between 0.25 and 1.0 $g/m^2$. In a more preferred embodiment of the present invention, the optional toplayer has a coating thickness between 0.25 and 1.75 $g/m^2$ and comprises a polyvinylalcohol having a hydrolysis degree ranging between 74 mol % and 99 mol % and a viscosity number as defined above ranging between 3 and 26.

The overcoat layer may comprise other ingredients such as anionic surfactants, e.g. sodium alkyl sulphate or sodium alkyl sulphonate, sodium dioctylsulfosuccinate, sodium dodecylbenzenesulfonate, and ammoniumlaurylsulfate; amphoteric surfactants, e.g. alkylaminocarboxylate and alkylamino-dicarboxylate; non-ionic surfactants, e.g. polyethylene glycol, polypropylene glycol, and copolymer of ethylene glycol and propylene glycol, polysiloxane surfactants, perfluorocarbon surlactants, alkylphenyl ethylene oxide condensate, alkoxylated alkylene diamines disclosed in EP 1 085 380 (paragraph [0021] and [0022]), glycerine, inorganic particles, acids, pigments, etc. Various organic or inorganic micro particles may be added into the overcoat to, for example, reduce the tackiness or moisture sensitivity of the plate. The acid which is preferably water soluble and has a low molecular weight. Said acid may be an inorganic acid or an organic acid as disclosed in EP 2 149 071 page 27 lines 1 to 21. The overcoat layer may optionally include other ingredients such as matting agents or wetting agents as disclosed in EP 2 916 171 and are incorporated herein by reference.

The overcoat can be formed on the printing plate by coating a solution or dispersion, or by laminating a polymeric film. The coating can be performed by any known method, such as roller coating, slot coating, curtain coating, Mayer rod coating, dip coating, or spray coating; preferably roller coating or slot coating. The coated overcoat is further dried to remove the water and/or any solvent, preferably by forced hot air drying, radiation drying, or combination of forced air drying and radiation drying. The solution or dispersion containing a film-forming polymer suitable for forming the overcoat can be a water soluble polymer solution (containing water soluble polymer) or polymer dispersion (including polymer emulsion and latex, containing water-insoluble polymer, with or without addition water soluble polymer), preferably a water soluble polymer solution. Various additives, such as further surfactants, wetting agents, defoamers, leveling agents and dispersing agents can be added to the overcoat to facilitate, for example, the coating and/or development process.

The polymeric film suitable for laminating onto the photosensitive layer to form the overcoat can be any polymeric film, such as polymer films based on polyester (including polyethylene terephthalate), polyethylene, polypropylene, ethylene/propylene copolymer, polystyrene, polyvinyl butyrol, polynitrile, polyamide, polyimide, polyvinyl chloride, polycarbonate, polymethylmethacrylate, acrylate/styrene copolymer, methacrylate/styrene copolymer, polyurethane, epoxy-amine polymer, nylon, Teflon, cellulose and its film forming derivatives, and polyvinyl acetate. Polyester, polyethylene and polypropylene are preferred polymeric film; and polyester is more preferred.

The overcoat is preferably removed on press with fountain solution during on-press development.

The Lithographic Printing Plate Precursor

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution. "Hardened" means that the coating becomes insoluble or non-dispersible for the developing solution and may be achieved through polymerization and/or crosslinking of the photosensitive coating, which may be enhanced by the heating step as described above.

Support

The lithographic printing plate used in the present invention comprises a support which has a hydrophilic surface or which is provided with a hydrophilic layer. The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 μm. The aluminum substrate of the current invention has preferably an Ra value below 0.45 μm, more preferably below 0.40 μm and most preferably below 0.30 μm. The lower limit of the Ra value is preferably about 0.1 μm. More details concerning the preferred Ra values of the surface of the grained and anodized aluminum support are described in EP 1 356 926. By anodising the aluminum support, an $Al_2O_3$ layer is formed and the anodic weight (g/m$^2$ $Al_2O_3$ formed on the aluminum surface) varies between 1 and 8 g/m$^2$. The anodic weight is preferably ≥3 g/m$^2$, more preferably ≥3.5 g/m$^2$ and most preferably ≥4.0 g/m$^2$.

The grained and anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

In the current invention, post treatment of the aluminum oxide surface with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and/or acetals of polyvinyl alcohols formed by reaction with a sulphonated aliphatic aldehyde, is especially preferred. More preferred is post treatment of the aluminum oxide surface with polyvinylphosphonic acid, polyvinylmethylphosphonic acid, phosphoric acid esters of polyvinyl alcohol and/or polyvinylsulphonic acid. Most preferred is the treatment of the aluminum oxide surface with polyvinylphosphonic acid.

Another useful post-anodic treatment may be carried out with a solution of polyacrylic acid or a polymer comprising at least 30 mol % of acrylic acid monomeric units, e.g. GLASCOL E15, a polyacrylic acid, commercially available from Ciba Speciality Chemicals.

Alternatively, the support may be treated with an adhesion promoting compound such as those described in EP 1 788 434 in [0010] and in WO 2013/182328.

Besides an aluminium support, a plastic support, for example a polyester support, provided with one or more hydrophilic layers as disclosed in for example EP 1 025 992 may also be used.

Photopolymer Coating

The coating has at least one layer including a photopolymerisable composition, said layer is also referred to as the "photopolymerisable layer". The photopolymerisable layer preferably has a coating thickness preferably ranging between 0.2 and 5.0 g/m$^2$, more preferably between 0.4 and 3.0 g/m$^2$, most preferably between 0.6 and 2.2 g/m$^2$. The coating may include other layers such as for example an adhesion-improving layer, located between the support and the photopolymerisable layer.

The photopolymerisable composition preferably includes a polymerisable compound. The polymerisable compound may be a monomer or oligomer including at least one epoxy or vinyl ether functional group and the polymerisation initiator is a Brönsted acid generator capable of generating free acid, optionally in the presence of a sensitizer. Suitable polyfunctional epoxy monomers and suitable Brönsted acid generators are disclosed in WO2014/198820 [048] and [049].

The polymerisable compound is most preferably a polymerisable monomer or oligomer including at least one terminal ethylenic group, hereinafter also referred to as "free-radical polymerisable monomer". The polymerisation involves the linking together of the free-radical polymerisable monomers.

Suitable free-radical polymerisable monomers are disclosed in [0050] and [0051] of WO2014/198820 and are incorporated herein by reference.

Initiator

In a highly preferred embodiment, the coating preferably contains a free radical initiator capable of generating free radicals upon exposure directly or in the presence of a sensitizer. Suitable free-radical initiators are described in WO 2005/111727 from page 15 line 17 to page 16 line 11 and EP 1 091 247 and may include for example hexaarylbisimidazole compound (HABI; dimer of triaryl-imidazole), aromatic ketones, aromatic onium salts, organic peroxides, thio compounds, keto-oxime ester compounds, borate compounds, azinium compounds, metallocene compounds, active ester compounds and further compounds having a carbon-halogen bond.

The coating, preferably the photopolymerisable layer, may also comprise a co-initiator. Typically, a co-initiator is used in combination with a free radical initiator. Suitable co-initiators for use in the photopolymer coating are disclosed in U.S. Pat. Nos. 6,410,205; 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161. Specific co-initiators, as described in EP 107 792, may be present in the photopolymerizable layer to further increase the sensitivity. Preferred co-initiators are disclosed in EP 2 916 171 [0051] and are incorporated herein by reference.

A very high sensitivity can be obtained by including a sensitizer such as for example an optical brightener in the coating. Suitable examples of optical brighteners as sensitizers are described in WO 2005/109103 page 24, line 20 to page 39. Other preferred sensitizers are blue, green or red light absorbing sensitizers, having an absorption spectrum between 450 nm and 750 nm. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/0124460, EP 1 241 002 and EP 1 288 720.

Infrared Absorbing Compound

In another preferred embodiment, the coating may include an infrared absorbing compound. The IR absorbing compound may be an infrared light absorbing dye or pigment. An infrared light absorbing dye is preferred, also referred to herein as IR-dye. The infrared light absorbing dye preferably has an absorption spectrum between 750 nm and 1300 nm, preferably between 780 nm and 1200 nm, more preferably between 800 nm and 1100 nm. The IR absorbing compound absorbs infrared light and converts the absorbed energy into heat.

The concentration of the IR-dyes with respect to the total dry weight of the coating, is preferably from 0.25 wt % to 25.0 wt %, more preferably from 0.5 wt % to 20.0 wt %, most preferred from 1.0 wt % to 10.0 wt %.

The infrared absorbing compound can be present in the photopolymerizable layer; and/or in the overcoat layer; and/or in an optional other layer. Preferred IR absorbing compounds are dyes such as cyanine, merocyanine, indoaniline, oxonol, pyrilium and squarilium dyes or pigments such as carbon black. Examples of suitable IR absorbers are described in e.g. EP 823 327, EP 978 376, EP 1 029 667, EP 1 053 868, EP 1 093 934; WO 97/39894 and WO 00/29214. Particular preferred dyes are heptamethinecyane dyes, especially the dyes disclosed in EP 1 359 008 paragraph [0030] to [0032].

Binder

The coating preferably includes a binder, preferably, the binder is present in the photopolymerizable layer. The binder can be selected from a wide series of organic polymers. Compositions of different binders can also be used. Useful binders are described in WO2005/111727 page 17 line 21 to page 19 line 30, EP 1 043 627 in paragraph [0013] and in WO2005/029187 page 16 line 26 to page 18 line 11. Suitable binders include hydrophilic binders such as homopolymers and copolymers of vinyl alcohol, acrylamide, methylol acrylamide, methylol methacrylamide, acrylic acid, methacrylic acid, hydroxyethyl acrylate, hydroxyethyl methacrylate and maleic anhydride/vinylmethylether copolymers.

Other Ingredients

Optionally, the coating may further contain additional ingredients. These ingredients may be present in the photopolymerizable layer or in an optional other layer.

For example, the photopolymerizable layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 [0053] to [0056] are incorporated herein by reference.

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may further comprise an adhesion promoting compound which may improve the adhesion between the coating and the support and the durability of the plate in the printing process. The adhesion promoting compound is a compound capable of interacting with the support, preferably a compound having an addition-polymerizable ethylenically unsaturated bond and a functional group capable of interacting with the support; for example a phosphate group, a phosphonate group and a trialkoxysilane group. The compound can be present in the photopolymerisble layer or in an intermediate layer between the support and the photopolymerisable layer. Suitable examples thereof are disclosed in EP 1 788 434 in [0010], WO 2013/182328, EP 851 299, EP 1 091 251, US 2004/214105, EP 1 491 356, US 2005/39620, EP 1 495 866, EP 1 500 498, EP 1 520 694 and EP 1 557 262, EP 2 212 746 and EP 2007/059379.

Various surfactants may be added into the photopolymerisable layer to allow or enhance the developability of the precursor; especially developing with a gum solution. Both polymeric and small molecule surfactants for example non-ionic surfactants are preferred. More details are described in EP 2 916 171 [0059] and are incorporated herein by reference.

Preferably the coating includes a printing-out agent, i.e. a compound which is capable of changing the color of the coating upon exposure. After image-wise exposing the precursor, a visible image can be produced, also referred to as "print-out image". The printing-out agent may be a compound as described in EP-A-1 491 356 paragraph [0116] to [0119] on page 19 and 20, and in US 2005/008971 paragraph [0168] to [0172] on page 17. Preferred printing-out agents are the compounds described in EP 1 765 592 from line 1 page 9 to line 27 page 20. More preferred are the IR-dyes as described in EP 1 736 312 from line 32 page 5 to line 9 page 32. The contrast of the image formed after image-wise exposure and processing enables the end-user to establish immediately whether or not the precursor has already been exposed and processed, to distinguish the different color selections and to inspect the quality of the image on the plate precursor. In order to obtain a good visual contrast for a human observer the type of color of the colorant may also be important. Preferred colors for the colorant are cyan or blue colors, i.e. under blue color we understand a color that appears blue for the human eye.

Method for Making a Lithographic Printing Plate Precursor

According to the present invention there is also provided a method for making a negative-working lithographic printing plate comprising the steps of imagewise exposing the printing plate precursor of the present invention followed by developing the imagewise exposed precursor so that the non-exposed areas are dissolved in the developer solution. The lithographic printing plate precursor can be prepared by (i) applying on a support as described above the coating as described above and (ii) drying the precursor.

Exposure Step

The printing plate precursor is preferably exposed to laser light. Preferably, the image-wise exposing step is carried out off-press in a platesetter, i.e. an exposure apparatus suitable for image-wise exposing the precursor with a laser such as a laser diode, emitting around 830 nm, a Nd YAG laser, emitting around 1060 nm, a violet laser, emitting around 400 nm, or a gas laser such as an Ar laser, or with a digitally modulated UV-exposure set-up, using e.g. digital mirror devices, or by a conventional exposure in contact with a mask. Preferably, the precursor is image-wise exposed by a laser emitting IR-light (i.e. wavelengths ranging between 750 and 1500 nm) or violet light (i.e. wavelengths ranging between 350 and 450 nm); most preferred by a laser emitting violet light.

Preheat Step

After the exposing step, the precursor is pre-heated as described above whereby the compound capable of generating volatile decomposition products generates gasses and also the polymerization and/or crosslinking reaction of the photopolymerisation layer may be enhanced. The heating is preferably at a temperature between 80° C. and 300° C. more preferably between 100° C. and 250° C. and most preferably between 120° and 200° C. The applied period of this heat; i.e. the dwell time, is preferably between 2 s and 30 minutes, more preferably between 10 s and 15 minutes and most preferably between 15 s and 10 minutes. This heating step may be performed in a preheating unit comprising a heating element such as for example an IR-lamp, an UV-lamp, heated air or a heated roll.

Development Step

Subsequently to the exposing step and the preheat step, the plate precursor may be processed. Before developing the imaged precursor, a pre-rinse step might be carried out to remove the protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, only dampening liquid is supplied to the plate during start-up of the press. After a number of revolutions of the plate cylinder, preferably less than 50 and most preferably less than 5 revolutions, also the ink supply is switched on. In an alternative embodiment, supply of dampening liquid and ink can be started simultaneously or only ink can be supplied during a number of revolutions before switching on the supply of dampening liquid.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise anionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 $g/m^2$ of the surface protective compound, more preferably between 0.010 and 10 $g/m^2$, most preferably between 0.020 and 5 $g/m^2$. More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727. The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Drying and Baking Step

After the processing step the plate may be dried in a drying unit. In a preferred embodiment the plate is dried by heating the plate in the drying unit which may contain at least one heating element selected from an IR-lamp, an UV-lamp, a heated metal roller or heated air.

After drying the plate can optionally be heated in a baking unit. More details concerning the heating in a baking unit can be found in WO 2007/057348 page 44 line 26 to page 45 line 20.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

Examples

1. Preparation of the Lithographic Supports S-01 and S-02

Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm². Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm², then washed with demineralised water for 11 seconds and dried at 120° C. for 5 seconds.

The support thus obtained was characterised by a surface roughness Ra of 0.35-0.4 μm (measured with interferometer NT1100) and had an anodic weight of 3.0 g/m².

Support S-02

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm². Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm², then washed with demineralised water for 11 seconds and post-treated for 3 seconds (by spray) with a solution containing 1.1 g/l PVPA at 70° C., rinsed with demineralised water for 1 seconds and dried at 120° C. for 5 seconds.

The support thus obtained was characterised by a surface roughness Ra of 0.35-0.4 μm (measured with interferometer NT1100) and had an anodic weight of 3.0 g/m².

2. Preparation of the Printing Plate Precursors

Photosensitive Layer

The printing plate precursors were produced by coating onto the above described supports S-01 and S-02 the photopolymerisable layers PL-01 and PL-02 as defined in Table 1 dissolved in a mixture of 36% by volume of MEK and 64% by volume of Dowanol PM (1-methoxy-2-propanol, commercially available from DOW CHEMICAL Company). The coating solutions PL-01 and PL-02 were applied at a wet coating thickness of 30 μm and then dried at 120° C. for 1 minute in a circulation oven.

TABLE 1 dry coating weight of the photosensitive layer PL-01 and PL-02

| (Dry weight) | Ingredients PL-01 mg/m² | PL-02 mg/m² |
|---|---|---|
| Tegoglide 410 (1) | 2 | 2 |
| GOHSEFIMER L 5407 (2) | 86 | 86 |
| FST 510 (3) | 333 | 298 |
| SR 368 (4) | 333 | 298 |
| HABI 1-2 (5) | 64 | 128 |
| Fluomix (6) | 71 | 106 |
| MBI (7) | 43 | 14 |
| Aerosil 150 (8) | 53 | 53 |
| DISI43236/2 (9) | 90 | 90 |
| Albritect CP30 (10) | 30 | 30 |
| Sipomer PAM 100 (11) | 178 | 178 |

(1) Tegoglide 410 ™ is a surfactant commercially available from Evonik Tego Chemie GmbH;

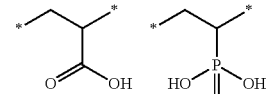

(2) GOHSEFIMER L 5407 commercially available from ALDRICH;

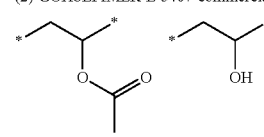

(3) FST510 is a di-urethanedimethacrylate commercially available from AZ Electronic;

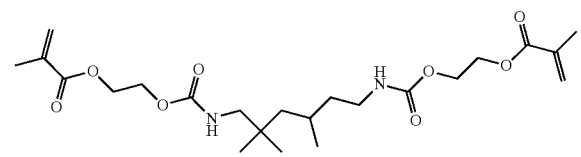 [SMILES: C=C(C)C(=O)OCCOC(=O)NCCC(C)CC(C)(C)CNC(=O)OCCOC(=O)C(=C)C]

(4) SR368 commercially available from Sartomer;

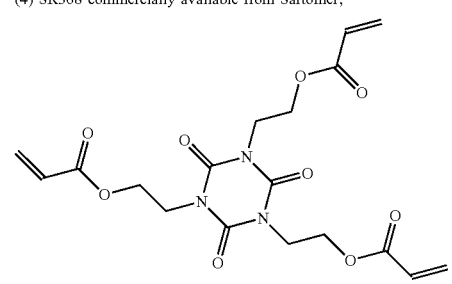

(5) HABI is 2,2'-bis(o-chlorophenyl)-4,4',5,5'-tetraphenylbiimidazole commercially available from SUMITOMO;

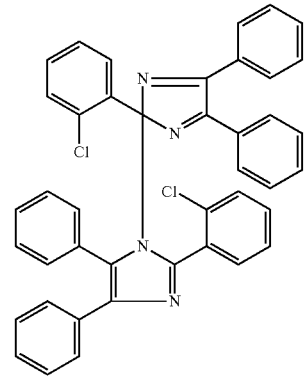 [SMILES: Clc1ccccc1-c1nc(-c2ccccc2)c(-c2ccccc2)n1C1(c2ccccc2Cl)N=C(c2ccccc2)C(c2ccccc2)=N1]

TABLE 1-continued dry coating weight of the photosensitive layer
PL-01 and PL-02

| (Dry weight) | Ingredients | |
|---|---|---|
| | PL-01 mg/m² | PL-02 mg/m² |

(6) Fluomix is a violet sensitizer mixture consisting of the following compounds:

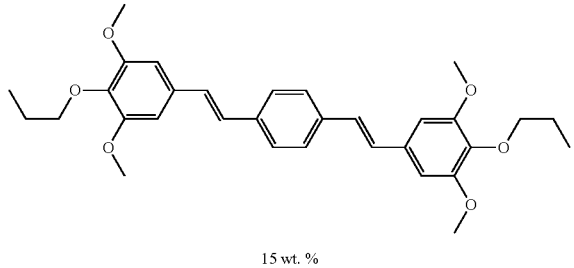

15 wt. %

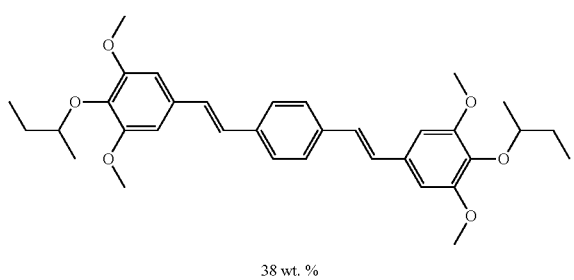 [SMILES: CCC(C)Oc1c(OC)cc(/C=C/c2ccc(/C=C/c3cc(OC)c(OC(C)CC)c(OC)c3)cc2)cc1OC]

38 wt. %

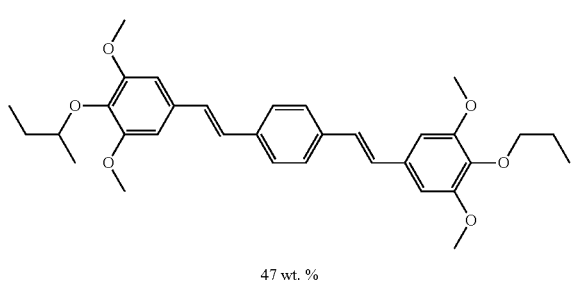 [SMILES: CCCOc1c(OC)cc(/C=C/c2ccc(/C=C/c3cc(OC)c(OC(C)CC)c(OC)c3)cc2)cc1OC]

47 wt. %

(7) MBI is 2-mercapto-benzimidazool;
(8) Aerosil 150 is a silica particle with a surface area (BET) of 135-165 m²/g commercially available from DEGUSSA;
(9) DISI 43236/2 is a pigment dispersion of 20% MK9352, DCC blue A3RN, indanthrone blue commercially available from DOMINION COLOUR CORPORATION and 20% DISPERBYK 182 commercially available from BYK Chemie GmbH in Dowanol PM (1-methoxy-2-propanol is commercially available from DOW CHEMICAL Company);
(10) Albritect CP30 is a poly (acrylic acid) poly (vinylphosphonic acid) 70/30 copolymer commercially available from RHODIA;
(11) Sipomer PAM 100 is a phosphate esters of polyethylene glycol monomethacrylate commercially available from RHODIA.

Top Layer

On top of the photosensitive layer an aqueous solution including the composition as defined in Table 2 was coated (40 μm wet thickness) and dried at 120° C. for 2 minutes. The compositions of the different top layers are defined in Table 2.

TABLE 2

Composition of the overcoats OC-01 to OC-04

| Dry weight | Components | | | |
|---|---|---|---|---|
| | OC-01 mg/m² | OC-02 mg/m² | OC-03 mg/m² | OC-04 mg/m² |
| Mowiol 4-88 (1) | 1225 | 1094 | 1125 | 1225 |
| IF-01 (2) | 0 | 392 | 0 | 0 |
| IF-02 (3) | 0 | 0 | 300 | 300 |
| Lutensol A8 (4) | 25 | 25 | 25 | 25 |
| Total dry weight | 1250 | 1513 | 1450 | 1550 |

(1) Mowiol 488 ™ is partially hydrolyzed polyvinyl alcohols commercially available from Kuraray;
(2) IF-01 is a dispersion of 10% (synthesis compound) and 5% Poval 4 88 commercially available from Kuraray;
(3) IF-02 is a dispersion of 10% Celocren OT(p,p'-oxybis(benzenesulfonyl hydrazide) commercially available from Chempoint and 5% Poval 4 88 commercially available from Kuraray;

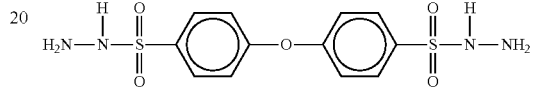

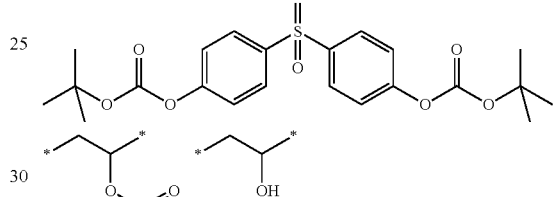

(4) Lutensol A8 ™ is a surface active agent commercially available from BASF.

The printing plate precursors PPP-01 to PPP-06 were obtained. Table 3 gives an overview of the inventive and comparative printing plate precursors PPP-01 to PPP-06.

TABLE 3

Overview of the printing plate precursors PPP-01 to PPP-06

| Printing plate precursor | Substrate | Coating Composition | Overcoat |
|---|---|---|---|
| PPP-01 Comparative | S-01 | PL-01 | OC-01 |
| PPP-02 Inventive | S-01 | PL-01 | OC-02 |
| PPP-03 Inventive | S-01 | PL-01 | OC-03 |
| PPP-04 Comparative | S-01 | PL-02 | OC-01 |
| PPP-05 Inventive | S-01 | PL-02 | OC-02 |
| PPP-06 Inventive | S-02 | PL-02 | OC-04 |

3. Heat Treatment

The printing plate precursors PPP-01 to PPP-06 were treated for 5 minutes in a circulation oven at 160° C. Every plate was placed at the same location in the furnace and removed from the furnace after the heat treatment. A Heraeus UT 6120 Furnace™ with a forced air circulation was used for the heat treatment.

When the printing plate precursors were cooled down to room temperature, the obtained printing plate precursors were exposed to white light (see below).

Also a non-heated printing plate precursor PPP-06 (Reference Example) was exposed to white light (see below).

4. White Light Stability Test

In a first step, a plate precursor is covered with a grey wedge (including steps of a constant of 0.15) and subsequently exposed to light (fluorescent tubes TL-D58W/840) for a period of 5 minutes. The fluorescent tubes produce an illuminance—measured at the plate surface—of about 1000 Lux.

Table 4 gives the correlation between the steps on the grey wedge, transmission of light and the amount of Lux. For example, step 1 has no filter and light passes fully through resulting in 1000 Lux while at step 2 only 71% of light passes through resulting in 708 Lux.

TABLE 4 correlation between the steps on the grey wedge and de resulting transmission

| Step on the wedge | Transmission of light % | Illuminance Lux |
|---|---|---|
| 1 | 100 | 1000 |
| 2 | 71 | 708 |
| 3 | 50 | 501 |
| 4 | 35 | 355 |
| 5 | 25 | 251 |
| 6 | 18 | 178 |
| 7 | 13 | 126 |
| 8 | 9 | 90 |
| 9 | 6 | 63 |
| 10 | 4 | 45 |
| 11 | 3 | 32 |
| 12 | 2 | 22 |
| 13 | 2 | 16 |
| 14 | 1 | 11 |
| 15 | 1 | 8 |

In a second step, after the light exposure (5 minutes), the obtained plate precursor is processed (see below) and the step of the wedge at which no polymerization of the coating has occurred, is determined. Areas where polymerisation occurred are visible as colored areas on the support. The lower the step number, the better the white light stability of the printing plate precursor. Indeed, the best result is obtained when no steps are observed, or in other words when no polymerization occurs at step 1 which means that the sample is stable under 1000 Lux for at least 5 minutes. If for example, the step of the wedge at which no polymerization occurs is step 4, then the sample is stable under 350 Lux (35% of the total illuminance) for 5 minutes.

The white light stability is defined as the amount of Lux multiplied by the exposure time, thus the white light stability for the latter example is 350 Lux×5 minutes=1750 Lux*min.

5. Development

The printing plate precursors PPP-01 to PPP-06 were processed with Violet CF GUM-NP™ commercially available from Agfa Graphics NV in an Azura C95 Processor™ (Speed 60 cm/min, at 21° C.), available from Agfa Graphics NV, to remove the coating in the non-image areas from the support. Printing plates PP-01 to PP 06 were obtained.

6. Results

The results of the white light stability test are summarized in Table 5 below.

TABLE 5

White light stability of printing plates PP-01 to PP-05*

| Printing Plate | Step on the wedge without polymerization | Related Illuminance Lux | White light stability Lux*min | |
|---|---|---|---|---|
| PP-01 Comparative | 11 | 32 | 158 | |
| PP-03 Inventive | 7 | 126 | 629 | |
| PP-04 Comparative | 11 | 32 | 158 | ** |
| PP-05 Inventive | 7 | 126 | 629 | |

*heat treatment of 5 minutes

The results in Table 5 show that the white light stability of the inventive printing plates (i.e. PP-03 and PP-05) including the inventive compounds in the overcoat is substantially higher compared to the comparative printing plates (PP-01 and PP-04).

2. Effect of the Support

The results of the white light stability for printing plate PP-06 is given in Table 6. PP-06 was prepared using support S-02 which was post treated with a hydrophilic polymer. A printing plate which was not heat treated is included in the Example as a Reference Example.

TABLE 6

White light stability of printing plate PP-06

| Printing Plate | Heat treatment 5 minutes | Step on the wedge without polymerization | Related Illuminance Lux | White light stability Lux*min |
|---|---|---|---|---|
| PP-06 Reference | no | 10 | 45 | 223 |
| PP-06 Inventive | yes | 1 | 1000 | >5000 |

The results in Table 6 show that PP-06 has, after heat treatment, a light stability of more than 5000 Lux and illustrates the significant effect of the post treatment of the support.

The invention claimed is:

1. A method for making a printing plate comprising:
   image-wise exposing a lithographic printing plate precursor to heat and/or light;
   heating the printing plate precursor; and
   developing the printing plate precursor, wherein the developing is performed on press by mounting the exposed printing plate precursor on a plate cylinder of a lithographic printing press and rotating the plate cylinder while supplying dampening liquid and/or ink to the photopolymerizable coating, and
   wherein the lithographic printing plate precursor comprises:
   a support;
   a photopolymerizable coating provided on the support; and
   an overcoat provided on the photopolymerizable coating, wherein the overcoat includes a compound that is able to generate a volatile decomposition product.

2. The method according to claim 1, wherein the image-wise exposing includes image-wise exposing the printing plate precursor with laser light having a wavelength between 350 nm and 450 nm.

3. The method according to claim 1, wherein the heating includes heating the printing plate precursor at a temperature between 80° C. and 300° C.

4. The method according to claim 1, wherein the heating includes heating the printing plate precursor for a dwell time between 2 seconds and 30 minutes.

5. The method according to claim 1, wherein the compound includes a heat decomposable compound.

6. The method according to claim 1, wherein the compound includes a blowing agent.

7. The method according to claim 5, wherein the heat decomposable compound is selected from the group consisting of carbonates, carbamates, and hydrazides.

8. The method according to claim 6, wherein the heat decomposable compound is selected from the group consisting of ammonium carbonate, ammonium hydrogen carbonate, ammonium carbamate, benzenesulfonyl hydrazide, and p-toluenesulfonyl hydrazide.

9. The method according to claim 1, wherein the volatile decomposition product is an inert gas or a gas that is not condensable at room temperature.

10. The method according to claim 1, wherein the volatile decomposition product is selected from the group consisting of carbon dioxide, carbon mono-oxide, ammonia, oxygen, hydrogen gas, and/or nitrogen gas.

11. The method according to claim 1, wherein the compound is present in the overcoat between 10 wt. % and 60 wt. %.

12. The method according to claim 1, wherein the photopolymerizable coating includes a polymerizable compound and a free radical initiator.

13. The method according to claim 1, wherein the support is grained and anodized aluminum post treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and/or acetals of polyvinyl alcohols formed by reaction with a sulphonated aliphatic aldehyde.

* * * * *